United States Patent

Duinkerken et al.

[11] Patent Number: 5,482,887
[45] Date of Patent: Jan. 9, 1996

[54] METHOD OF MANUFACTURING A SEMICONDUCTOR DEVICE WITH A PASSIVATED SIDE

[75] Inventors: Geert J. Duinkerken; Roelvinus M. M. Fonville, both of Stadskanaal, Netherlands

[73] Assignee: U.S. Philips Corporation, New York, N.Y.

[21] Appl. No.: 173,295

[22] Filed: Dec. 22, 1993

[30] Foreign Application Priority Data

Dec. 23, 1992 [EP] European Pat. Off. .............. 92204064

[51] Int. Cl.$^6$ .................................................. H01L 21/301
[52] U.S. Cl. .............................. 437/62; 437/226; 437/67; 148/DIG. 12
[58] Field of Search ................................ 437/226, 62, 67, 437/974; 148/DIG. 12, DIG. 135; 257/620, 622

[56] References Cited

U.S. PATENT DOCUMENTS

| | | | |
|---|---|---|---|
| 3,579,815 | 5/1971 | Gentry | 437/226 |
| 3,852,876 | 12/1974 | Sheldon et al. | 437/226 |
| 3,881,162 | 4/1975 | Caddock | 438/61 |
| 4,080,621 | 3/1978 | Funakawa et al. | 257/620 |
| 4,179,794 | 12/1979 | Kosugi et al. | 437/226 |
| 4,904,609 | 2/1990 | Temple | 437/203 |
| 5,124,274 | 6/1992 | Ohki et al. | 437/62 |
| 5,254,212 | 10/1993 | Someji et al. | 156/630 |
| 5,393,711 | 2/1995 | Biallas et al. | 637/226 |

FOREIGN PATENT DOCUMENTS

| | | |
|---|---|---|
| 2538616 | 6/1984 | France . |
| 2930460 | 1/1981 | Germany . |
| 9308592 | 4/1993 | Germany . |
| 56-30777 | 3/1981 | Japan ....................... 437/226 |
| 58-75841 | 7/1983 | Japan ....................... 437/67 |

*Primary Examiner*—Olik Chaudhuri
*Assistant Examiner*—S. Mulpuri
*Attorney, Agent, or Firm*—Steven R. Biren

[57] ABSTRACT

A method of manufacturing semiconductor devices with a passivated semiconductor body (1) provided with an electrode (2) and fastened on an electrically conducting support body (3), in which method a slice of semiconductor material (5) is fastened on a surface (6) of an electrically conducting auxiliary slice (7), and mesa structures (8) are formed in the slice of semiconductor material (5) by the application of grooves (9) in the slice of semiconductor material (5) subsequently, a layer of insulating material (10) is provided on the walls of the grooves (9), electrodes (2) are provided on upper sides (11) of the mesa structures (8), and the auxiliary slice (7) with the mesa structures (8) is split up at the areas of the grooves (9) into individual semiconductor bodies (1) each fastened on its own support body (3). According to the invention, the electrodes (2) are provided in that an electrically conducting layer (25) is deposited both on the upper side (11) of the mesa structures (8) and on the layer of insulating material (10) and, during splitting-up of the auxiliary slice (7) with mesa structures (8), this layer (25) is also split up into separate electrodes (2) which lie on the upper side (11) of a mesa structure (8) as well as on the layer of insulating material (10). The method according to the invention is simpler than a known method. Moreover, semiconductor devices are made by the method according to the invention which have a better resistance to higher voltages because the electrodes (2) also extend over the insulating material (10).

8 Claims, 3 Drawing Sheets

METHOD OF MANUFACTURING A SEMICONDUCTOR DEVICE WITH A PASSIVATED SIDE

BACKGROUND OF THE INVENTION

The invention relates to a method of manufacturing semiconductor devices having a passivated semiconductor body provided with an electrode and fastened on an electrically conducting support body, in which method a slice of semiconductor material is fastened on a surface of an electrically conducting auxiliary slice and mesa structures are formed in the slice of semiconductor material by the application of grooves in the slice of semiconductor material, after which a layer of insulating material is provided on the walls of the grooves, electrodes are provided on upper sides of the mesa structures, and the auxiliary slice comprising the mesa structures is split up at the areas of the grooves into separate semiconductor bodies each fastened on its own support body. The invention also relates to a semiconductor device comprising a semiconductor body fastened on a support body.

SUMMARY OF THE INVENTION

The semiconductor body may comprise, for example, a diode. The electrode and the support body then act as connections for the diode. A $p^{++}$-type silicon slice, for example, may be used as the electrically conducting auxiliary slice. Fastening of the slice of semiconductor material on the auxiliary slice may be effected, for example, by alloying with a metal layer, for example, an aluminium layer, but it is also possible to fasten the slices to one another by wafer bonding. Mesa structures are subsequently formed in the slice of semiconductor material in that grooves are provided in this slice, for example, by sawing, grinding or etching. The mesa structures then have plane upper sides or plateaus surrounded by the grooves, the walls of the grooves forming lateral edges of the mesa structures. The grooves may extend, for example, into the auxiliary slice and be so provided that the mesa structures form individual semiconductor bodies which are still connected to the auxiliary slice. A layer of insulating material such as an oxide or glass is provided on the groove walls, whereby these walls are passivated. Electrodes, for example made of metal, are provided on the upper sides of the mesa structures. The auxiliary slice and the mesa structures are then split up at the areas of the grooves into individual semiconductor devices, for example by breaking, etching or sawing.

German Patent no. 2930460 discloses a method of the kind mentioned in the opening paragraph whereby a passivated diode is manufactured. For this purpose, an approximately 200 µm thick slice of semiconductor material provided with a pn junction parallel to its upper side is fastened to an approximately 250 µm thick auxiliary slice by means of a metal layer. Mesa structures are then formed in the slice of semiconductor material by the application of grooves with a depth of approximately 250 µm in the slice of semiconductor material with a diamond saw blade at a sawing angle of 60°. The walls of the grooves are provided with a layer of insulating material by electrophoresis, i.e. an approximately 5 µm thick layer of zinc-borate silicate glass. Electrodes are provided on the upper sides of the mesa structures in that the layer of insulating material is covered with a photoresist mask and then an approximately 250 µm thick metal layer is selectively provided on the upper side of the mesa structure. Splitting-up of the auxiliary slice with the mesa structures takes place in that grooves corresponding to the grooves in the semiconductor slice are made in the exposed surface of the auxiliary slice.

The known method described has the disadvantage that the method is intricate; thus a photoresist mask as well as a selective deposition process for the metal layer is used for providing the electrodes on the upper sides of the mesa structures.

The invention has for its object inter alia to provide a method of manufacturing a semiconductor device which is less complicated.

According to the invention, the method is for this purpose characterized in that electrodes are provided through the application of an electrically conducting layer both on the upper side of the mesa structures and on the layer of insulating material and in that this electrically conducting layer is in its turn split up into separate electrodes, which lie both on the upper side of a mesa structure and on the layer of insulating material, during splitting-up of the auxiliary slice comprising the mesa structures.

It is achieved by this that the method is simpler. The invention is based on the recognition that it is not necessary for the application of an electrode on the upper side of the mesa structure to cover the layer of insulating material first with a photoresist mask and then to provide a metal layer selectively on the upper side of the mesa structure. It is found to be possible in practice to provide an electrically conducting layer over the entire surface of the slice of semiconductor material, so both over the layer of insulating material and over the upper sides of the mesa structures, and to also split up also the electrically conducting layer during splitting-up of the auxiliary slice and the mesa structures into individual semiconductor bodies each fastened on its own support body, for example by breaking, sawing or etching. The electrically conducting layer then overlaps the layer of insulating material.

Preferably, grooves are provided to a certain width and splitting-up takes place in that the auxiliary slice comprising mesa structures is sawn through, the width of the grooves being taken greater than that of a sawcut used during sawing. Such a groove width renders it possible to split up the auxiliary slice comprising mesa structures by sawing it through without damaging the layer of insulating material in those locations where this material passivates the semiconductor body. It is also possible then to saw from the upper side of the semiconductor slice. Splitting-up can then take place more accurately because the grooves are visible and it can be immediately checked whether the sawcut is made in the correct position. The correct position of the grooves is more difficult to determine in the known method, where splitting-up takes place from the lower side of the auxiliary slice.

An additional advantage is obtained when the layer of insulating material is provided to such a thickness at the area of the sawcut that the layer of insulating material is thicker there than the electrically conducting layer. The layer of insulating material then is so thick in relation to the electrically conducting layer that short-circuiting of the layer of insulating material by material of the electrically conducting layer or by material of the auxiliary slice is prevented during sawing-through of the semiconductor devices.

An additional advantage is obtained when the layer of insulating material is provided to such a thickness that the grooves are substantially entirely filled with insulating material. An exposed surface of this layer then lies practically at a level with the upper side of the mesa structures. The electrically conducting layer, which is provided on the layer of insulating material and on the upper sides of the mesa structures according to the invention, can then be provided in a more reliable manner with a smaller risk of interruptions because there are no major level differences in the surface to be covered.

The known semiconductor device may be mounted in a diode envelope, for example, one made of synthetic resin. Preferably, the semiconductor bodies with support body are given a plane sawcut surface during sawing-through which is suitable as a mounting surface for the semiconductor device. The mounting surface may be provided during splitting-up of the auxiliary slice and the mesa structures in that the electrically conducting layer, the layer of insulating material and the auxiliary slice are sawn through, for example by wire sawing, for example perpendicular to the upper surface of the mesa structures. The sawcut surface then comprises a portion of the support body, of the layer of insulating material and of the electrode. The sawcut surface is then also so smooth and plane that it can be used as a mounting surface. The semiconductor device is then immediately suitable for mounting as a surface mounted device (SMD) on a printed circuit board (PCB).

The method according to the invention is preferably characterized in that a slice of semiconductor material is used as the auxiliary slice which has such a thickness that a surface mounted device of standard dimensions is obtained. A semiconductor device obtained by the method can then be readily mounted with standard machines.

An additional advantage is obtained when the grooves are provided through removal of material from the slice of semiconductor material by bombardment with abrasive particles. In such a process, which is also called sandblasting or shot peening, as applicable, portions of the slice of semiconductor material can be removed in a simple manner and with a comparatively great accuracy. Such a method has the additional advantage over, for example, an etching process that it is an environmentally comparatively clean method because the abrasive particles can be collected and re-used. In addition, grooves of a width greater than the sawcut used during sawing can be provided in a comparatively simple manner by this method.

An additional advantage is obtained when the layer of insulating material is provided by filling the grooves with a glass dispersion and by subsequently subjecting the auxiliary slice comprising mesa structures to a heat treatment. The layer of insulating material may thus be provided in the grooves in a simple manner with a sufficient accuracy and with a sufficient thickness. It is not necessary, accordingly, as it is in the known method, to remove the layer of insulating material from surfaces other than the walls of the grooves by means of an etching step after this layer of insulating material has been provided. The glass dispersion is sintered by the elevated temperature of the heat treatment, whereby the layer of insulating material is given good insulating and passivating properties.

The invention also relates to a semiconductor device with a semiconductor body having a plane lower side, a plane upper side extending substantially parallel thereto on which an electrode is provided, and a lateral side, which semiconductor body is fastened with its plane lower side to a surface of an electrically conducting support body, a recess being formed around the semiconductor body or the support body, which recess extends up to the upper side of the semiconductor body and is covered with a layer of insulating material. According to the invention, this semiconductor device is characterized in that the layer of insulating material is so thick that the recess is substantially entirely filled, while the electrode provided on the upper side of the semiconductor body comprises an electrically conducting layer which overlaps the layer of insulating material. When a voltage is applied across the semiconductor device, the overlap of the conducting layer over the layer of insulating material has the advantage that an electric field present in the semiconductor device is reduced, especially near the upper side of the semiconductor body. The semiconductor device is accordingly resistant to higher voltages than semiconductor devices made by the known method. Such a semiconductor device, moreover, can be manufactured in a comparatively simple manner by the method set out above. In addition, the semiconductor device is well passivated by the insulation of the lateral side of the semiconductor body. It is not absolutely necessary therefore to mount the semiconductor device in a glass envelope. The semiconductor device satisfactorily withstands ambient influences such as moisture, temperature, etc also without an envelope or with a synthetic resin envelope.

Preferably, the semiconductor device is provided with a plane mounting surface which comprises a portion of the support body, of the layer of insulating material, and of the electrode. The semiconductor device may then be mounted directly with its mounting surface on a printed circuit board (PCB), after which an electrical connection between conductor tracks on the printed circuit board and the support body and the electrode may be made. Electrically, the semiconductor body is then connected between the conductor track in contact with the support body and the conductor track in contact with the electrode.

BRIEF DESCRIPTION OF THE DRAWING

The invention will be explained in more detail below by way of example with reference to several embodiments and the accompanying diagrammatic drawing, in which.

The Figures are purely diagrammatic and not drawn to scale. Corresponding parts are generally given the same reference numerals in the Figures.

DESCRIPTION OF THE PREFERRED EMBODIMENTS

Figure 1:
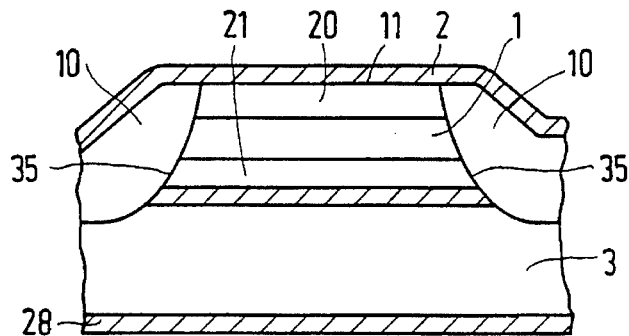
FIG. 1 is a cross-section of a semiconductor device made by the method according to the invention.

FIG. 1 shows an embodiment of a semiconductor device made by a method according to the invention comprising a passivated semiconductor body 1 provided with an electrode 2 and fastened on an electrically conducting support body 3. The semiconductor body 1 may comprise, for example, a diode. The semiconductor body 1 in that case comprises an n-type doped silicon body provided with regions 20 and 21 having an $n^+$ and $p^+$-type doping, respectively, so that a pn junction is created between the n-type semiconductor body and the region 21 (see FIG. 1 ). The electrode 2 and the support body 3 then act as connections for the diode. Since the support body 3 is electrically in series with the diode of the semiconductor body 1, an electrically conducting body is used, for example, a body made of semiconductor material of low ohmic value. Owing to the passivation of the semiconductor body 1, the semiconductor device need not be mounted in a highly protective glass envelope, but mounting in a less strongly protective envelope of synthetic resin is also possible.

Figure 2:
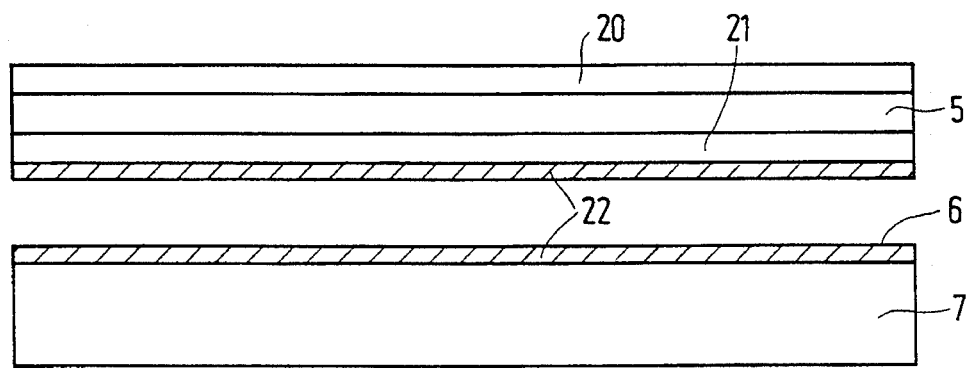
FIGS. 2 to 7 show various stages in the manufacture of a semiconductor device by the method according to the invention, FIGS. 2, 3, 4, 6 and 7 being cross-sections and FIG. 5 a plan view.
Figure 3:
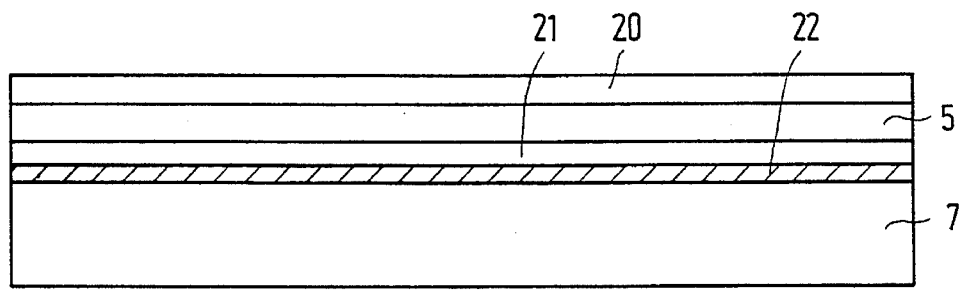
Figure 4:
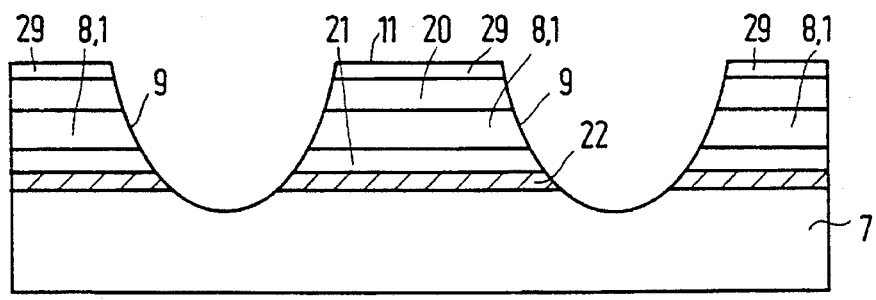
Figure 5:
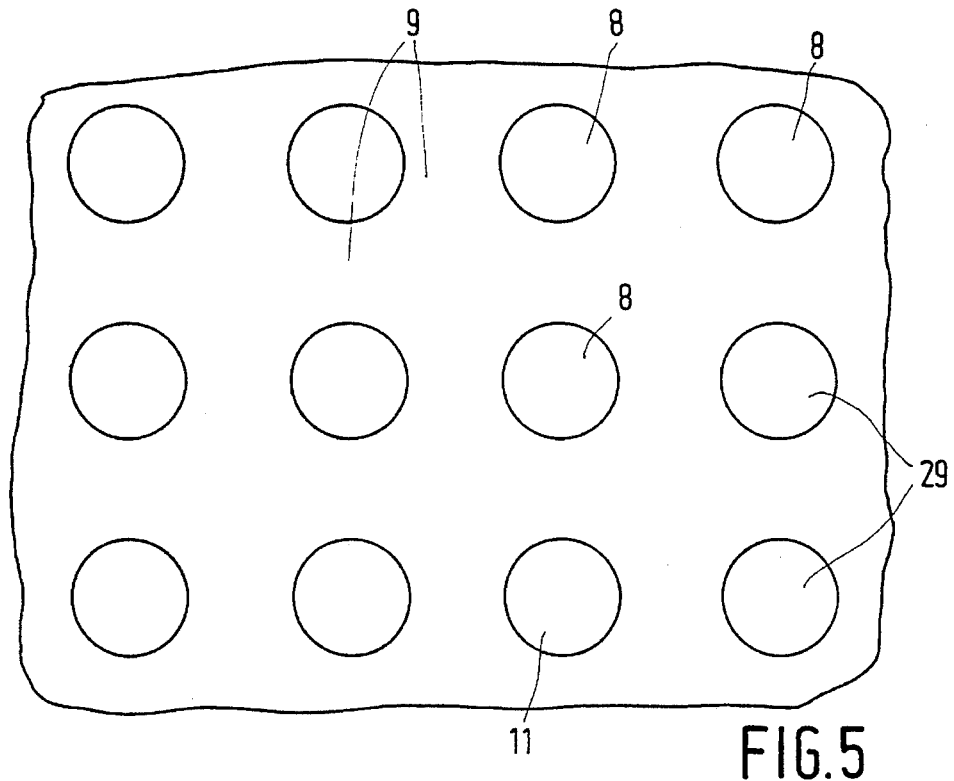
Figure 6:
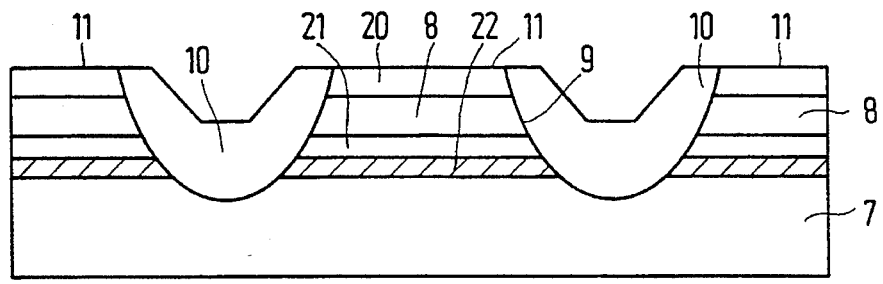

FIGS. 2 to 7 show an embodiment of the method by which this semiconductor device is manufactured. FIGS. 2 and 3 show how a slice of semiconductor material 5 is fastened on a surface 6 of an electrically conducting auxiliary slice 7. For example, a $p^{++}$-type silicon slice is used as the electrically conducting auxiliary slice 7. The slice of semiconductor material 5 is fastened on the auxiliary slice 7 by alloying with a metal layer 22 of silver, palladium or aluminium, for example, with an aluminium layer of approximately 10 μm thickness. For this purpose, an aluminium layer 22 with a thickness of approximately 5 μm is provided on the auxiliary slice 7 and on the slice of semiconductor material 5, after which the auxiliary slice 7 and the slice of semiconductor material 5 are put against one another with the aluminium layers 22, and a heat treatment of approximately 10 minutes at approximately 700° C. is carried out (see FIG. 3). Alternatively, the metal layer 22 may be provided on one of the slices 5 or 7. Mesa structures 8 are formed in the slice of semiconductor material 5 in that grooves 9 are provided in the slice of semiconductor material 5, for example by sawing, grinding or etching (see FIGS. 4, 5). The mesa structures 8 then have plane upper sides or plateaus 11 surrounded by the grooves 9, the walls of the grooves 9 forming lateral sides of the mesa structures 8. The grooves 9 may extend, for example, into the auxiliary slice 7 and be so provided that the mesa structures 8 form individual semiconductor bodies 1 which are still connected to the auxiliary slice 7 (see FIG. 4). Then a layer of insulating material 10, such as an oxide or glass, is provided on the walls of the grooves 9, whereby these walls are passivated (see FIG. 6). Electrodes 2, for example, made of metal are provided on upper sides 11 of the mesa structure (see FIG. 1). The auxiliary slice 7 with the mesa structures 8 is split up into separate semiconductor bodies 1 at the areas of the grooves 9, for example by breaking, etching or sawing, each semiconductor body being attached to its own support body 3.

In a known method for providing the electrodes 2 on the upper sides 11 of the mesa structures 8, the layer of insulating material 10 is covered with a photoresist mask, after which an approximately 250 μm thick metal layer is selectively provided on the upper side of the mesa structure. This known method has the disadvantage that it is intricate; thus a photoresist mask and a selective deposition process for the metal layer are used for providing the electrodes 2 on the upper sides 11 of the mesa structures.

Figure 7:
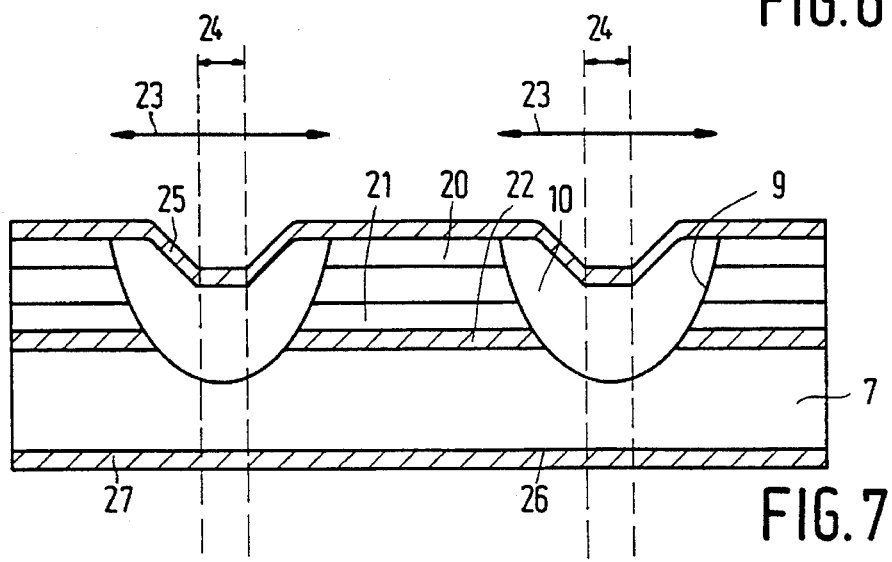

In the method according to the invention, the electrodes 2 are provided in that an electrically conducting layer 25 is applied both to the upper side 11 of the mesa structures 8 and to the layer of insulating material 10 and, during splitting-up of the auxiliary slice 7 comprising mesa structures 8, this layer 25 is also split up into separate electrodes 2 which each lie both on the upper side 11 of a mesa structure 8 and on the layer of insulating material 10 (see FIGS. 7, 1). The layer 25 comprises, for example, a solder layer or a Ti—Ni—Ag layer. An electrically conducting layer 27 may be provided in the same way on the lower side 26 of the auxiliary slice 7, for example, also made of solder or Ti—Ni—Ag. An electrode 28 is then formed at the lower side of the support body 3 during splitting-up, which renders possible a better contacting of the support body 3. Since the method according to the invention employs no photoresist mask and no deposition process, whereby metal is selectively deposited on the upper side of the mesa, the method is simpler than the known method.

Preferably, grooves 9 are provided to a certain width 23, and splitting-up takes place by sawing through the auxiliary slice 7 with mesa structures 8, the width 23 of the grooves 9 being chosen to be greater than a sawcut 24 used during sawing. Thus, for example, a groove width 23 of 500 μm is chosen, while a wire saw having a sawcut width 24 of 120 μm is used for sawing through the auxiliary slice 7. The layer of insulating material 10 is not damaged then in those locations where this layer passivates the semiconductor body 1. It is also possible in this case to carry out the sawing operation from the upper side of the semiconductor slice 5. Splitting-up may take place with a greater accuracy then because the grooves 9 are visible and it can be immediately checked whether the sawcut 24 is made in the correct position.

In an embodiment of the method, the layer of insulating material 10 is provided to such a thickness at the area of the sawcut 24 that the layer of insulating material 10 is thicker there than the electrically conducting layer 25 (see FIG. 7). Given a groove depth of approximately 240μm, the layer of insulating material 10 may be chosen to be, for example, 100 μm thick. The electrically conducting layer 25 is, for example, a 0.55 μm thick Ti—Ni—Ag layer. The layer of insulating material 10 is then so thick in relation to the electrically conducting layer 25 that short-circuiting of the layer of insulating material owing to smudging of material of the electrically conducting layer or material of the auxiliary slice 7 is prevented during sawing-through of the semiconductor devices. In a further embodiment of the method, the layer of insulating material 10 is provided to such a thickness that the grooves 9 are practically entirely filled with insulating material 10. An exposed surface of this layer then lies substantially at a level with the upper side 11 of the mesa structures 8. The electrically conducting layer 25, which is provided on the layer of insulating material 10 and on the upper sides 11 of the mesa structures 8 according to the invention, can then be deposited in a more reliable manner with a lower risk of interruptions because there are no major level differences in the surface to be covered.

The known semiconductor device can be mounted in a diode casing, for example, on a metal lead frame, and be provided with an envelope of synthetic resin. During sawing-through, the semiconductor bodies 1 with support bodies 3 are preferably provided with a plane sawcut surface which is suitable as a mounting surface 30 for the semiconductor device (see FIGS. 8, 9). The mounting surface 30 may be provided during splitting-up of the auxiliary slice 7 and the mesa structures 8 in that the electrically conducting layer 25, the layer of insulating material 10 and the auxiliary slice 7 are sawn through, for example by wire sawing, for example perpendicular to the upper surface 11 of the mesa. structures 8. The mounting surface 30 then comprises a portion of the support body 3, of the layer of insulating material 10, and of the electrodes 2 and 28. In addition, the sawcut surface is then so smooth and plane that it can be used as the mounting surface 30. The semiconductor device can then be mounted directly on a printed circuit board (PCB) as a surface mounted device (SMD) (see FIG. 9). The semiconductor device may be placed with its mounting surface 30 on a printed circuit board 31, after which conductor tracks 32 and 33 on the printed circuit board 31 are electrically connected to the electrodes 2 and the support body 3, respectively, or to the electrode 28, if present. An electrical connection with the conductor tracks may be effected, for example, by soldering.

In an embodiment of the method, a slice of semiconductor material is used as the auxiliary slice 7 which has such a thickness that a surface mounted device of standard dimensions is obtained. The auxiliary slice 7 then generally has a thickness of more than 1.0 min. Such a slice of semiconductor material is much thicker than slice thicknesses of approximately 200 μm used in practice. For example, a semiconductor slice 5 with a thickness of 240 μm is connected to a 1.76 mm thick auxiliary slice 7. A semiconductor device with the dimensions 20×12.5×12.5 mm$^3$ is then created, which corresponds to the 0805 standard dimension for SMDs. This measure achieves that a semiconductor device can be manufactured which complies with known standard dimensions for SMDs. Mounting of a semiconductor device obtained by the method is then readily realizable by means of standard machines.

In a further embodiment of the method according to the invention, the grooves 9 are provided through removal of material from the slice of semiconductor material 5 by bombardment with abrasive particles. In such a process, also called sandblasting or shot peening, as applicable, portions can be removed from the slice of semiconductor material 5 in a simple manner and with a comparatively high accuracy. Those regions where the upper sides 11 of the mesa structures 8 are to be created are covered on the slice of semiconductor material 5 then, for example by means of steel plates 29 (see FIGS. 4, 5). The shape of the mesa structures 8 is determined by the shape of these plates 29. The uncovered surface area of the slice of semiconductor material 5 is then removed by blasting with, for example, $Al_2O_3$ particles, after which the plates 29 are removed. Such a method has the additional advantage over, for example, an etching process that it is an environmentally comparatively clean method because the abrasive particles can be collected and re-used. In addition, grooves 9 having a width greater than the sawcut used during sawing can be provided relatively easily by this method.

An additional advantage is obtained when the layer of insulating material 10 is provided by filling the grooves 9 with a glass dispersion and subsequently subjecting the auxiliary slice 7 with mesa structures 8 to a heat treatment. The layer of insulating material 10 may thus be provided in the grooves 9 in a simple manner, sufficiently accurately, and to a sufficient thickness. Thus, for example, zinc-borate or lead-borate glass is deposited in the groove in the form of a dispersion from a dispensing device such as a nozzle. The dispersion remains in the grooves 9 owing to its surface tension and does not spread over the upper side 11 of the mesa structure. It is not necessary, therefore, to remove the layer of insulating material from, for example, the upper sides 11 of the mesa structures 8 by means of an etching step after this layer of insulating material 10 has been applied, in contrast to the known method. The heat treatment is carried out for approximately 20 minutes at 720° C. The glass dispersion is sintered by the elevated temperature of the heat treatment, whereby the layer of insulating material 10 is given good insulating and passivating properties.

Figure 8:
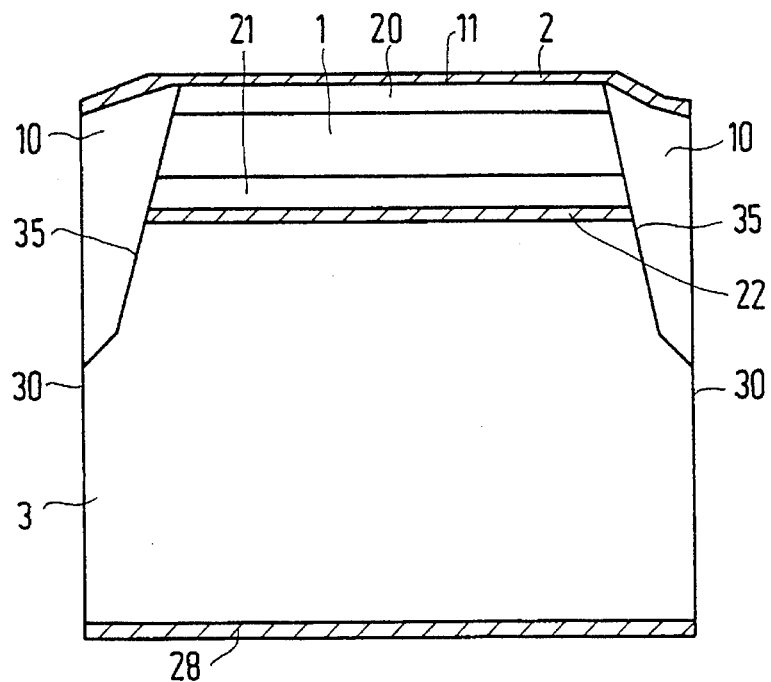
FIG. 8 is a cross-section of an embodiment of a semiconductor device made by the method according to the invention.
Figure 9:
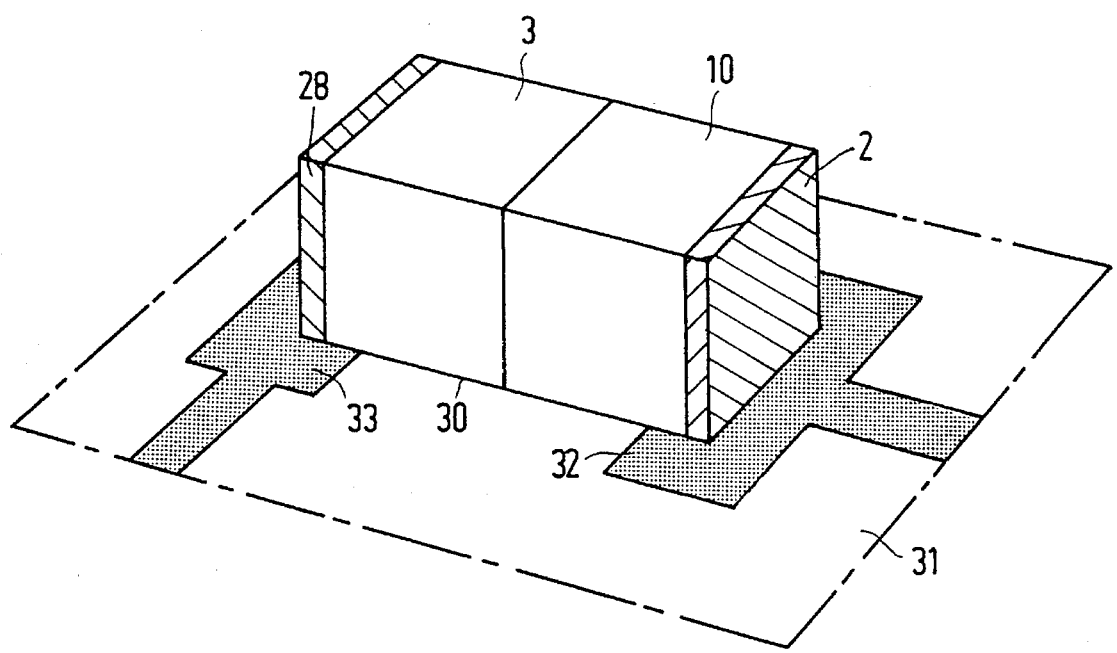
FIG. 9 is a perspective view of a semiconductor device made by the method according to the invention, mounted on a printed circuit board.

A semiconductor device according to FIG. 1 is manufactured by the method with a semiconductor body 1 having a plane lower side, a plane upper side 11 extending substantially parallel thereto on which an electrode 2 is provided, and a lateral side, which semiconductor body 1 is fastened with its plane lower side on a surface of an electrically conducting support body 3, a recess 35 being formed around the semiconductor body 1 or the support body 3, which recess extends up to the upper side 11 of the semiconductor body 1 and is covered with a layer of insulating material 10. According to the invention, the layer of insulating material 10 is so thick that the recess 35 is substantially entirely filled, while the electrode 2 provided on the upper side 11 of the semiconductor body 1 comprises an electrically conducting layer 25 which overlaps the layer of insulating material 10. When a voltage is applied across the semiconductor device, the overlap of the electrode 2 over the layer of insulating material 10 provides the advantage that an electric field present in the semiconductor device is reduced especially near the upper side of the semiconductor body 1. FIG. 8 shows an embodiment in which the semiconductor device is provided with a plane mounting surface 30 which comprises a portion of the support body 3, of the layer of insulating material 10, and also of the electrode 2. The semiconductor device may then be mounted with the mounting surface 30 directly on a printed circuit board 31, after which, an electrical connection between conductor tracks 32 and 33 on the printed circuit board 31 on the one hand and the electrode 2 and the support body 3, possibly provided with an electrode 28, on the other hand may be realized.

The invention is not limited to the embodiments given, since many modifications and variations are possible to those skilled in the art within the scope of the invention. Thus the slice of semiconductor material may be made from a material other than silicon such as, for example, germanium or GaAs. The auxiliary slice may alternatively be made of a high-conductivity metal, while the electrodes may be of materials other than Ti—Ni—Ag or solder. In addition, several pn junctions or passive elements may be present in the semiconductor body, for example, forming transistors and resistors.

We claim:

1. A method of manufacturing semiconductor devices each having a passivated semiconductor body provided with an electrode and fastened on an electrically conducting support body, in which a slice of semiconductor material is fastened on a surface of an electrically conducting auxiliary slice and mesa structures are formed in the slice of semiconductor material by forming grooves in the slice of semiconductor material, after which a layer of insulating material is provided on the walls of the grooves, an electrically conducting layer is applied over the entire resulting structure of the slice of semiconductor material comprising mesa structures and grooves, the auxiliary slice comprising the mesa structures is then split up at the areas of the insulated grooves into separate semiconductor bodies each fastened on its own support body, and this electrically conducting layer is split up into separate electrodes, which lie both on the upper side of a mesa structure and on the layer of insulating material, during splitting-up of the auxiliary slice comprising the mesa structures.

2. A method as claimed in claim 1, characterized in that grooves are provided to a width and splitting-up takes place by sawing through the auxiliary slice comprising mesa structures, the width of the grooves being greater than that of a sawcut used during sawing.

3. A method as claimed in claim 2, characterized in that the layer of insulating material is provided to such a thickness at the area of the sawcut that the layer of insulating material is thicker there than the electrically conducting layer.

4. A method as claimed in claim 3, characterized in that the layer of insulating material is provided to such a thickness that the grooves are substantially filled with insulating material.

5. A method as claimed in claim 2, characterized in that the semiconductor body with support body is given a plane sawcut surface during sawing-through which is suitable as a mounting surface for the semiconductor device.

6. A method as claimed in claim 5, characterized in that a slice of semiconductor material is used as the auxiliary slice which has such a thickness that a surface mounted device of standard dimensions is obtained.

7. A method as claimed claim 1, characterized in that the grooves are provided through removal of material from the slice of semiconductor material by bombardment with abrasive particles.

8. A method as claimed in claim 1, characterized in that the layer of insulating material is provided by filling the grooves with a glass dispersion and by subsequently subjecting the auxiliary slice comprising mesa structures to a heat treatment.

* * * * *